United States Patent
Ye et al.

(10) Patent No.: US 10,035,296 B2
(45) Date of Patent: Jul. 31, 2018

(54) METHODS FOR CONTROLLING SPREAD OF IMPRINT MATERIAL

(71) Applicant: Canon Kabushiki Kaisha, Tokyo (JP)

(72) Inventors: Zhengmao Ye, Austin, TX (US); Niyaz Khusnatdinov, Round Rock, TX (US); Edward Brian Fletcher, Austin, TX (US)

(73) Assignee: CANON KABUSHIKI KAISHA (JP)

( * ) Notice: Subject to any disclaimer, the term of this patent is extended or adjusted under 35 U.S.C. 154(b) by 18 days.

(21) Appl. No.: 15/292,645

(22) Filed: Oct. 13, 2016

(65) Prior Publication Data

US 2018/0104888 A1    Apr. 19, 2018

(51) Int. Cl.

| | |
|---|---|
| *B05D 3/12* | (2006.01) |
| *B29C 59/00* | (2006.01) |
| *B29C 37/00* | (2006.01) |
| *B29C 59/02* | (2006.01) |
| *H01L 21/027* | (2006.01) |
| *B29K 105/00* | (2006.01) |
| *B29L 31/34* | (2006.01) |

(52) U.S. Cl.
CPC ........ *B29C 59/002* (2013.01); *B29C 37/0025* (2013.01); *B29C 59/022* (2013.01); *B29C 59/026* (2013.01); *H01L 21/0271* (2013.01); *B29C 2059/023* (2013.01); *B29K 2105/0058* (2013.01); *B29L 2031/3425* (2013.01)

(58) Field of Classification Search
CPC ... B28B 1/14; B27N 3/18; B29C 35/08; A01J 21/00; B05D 3/12; B44C 1/22; C23C 16/52
See application file for complete search history.

(56) References Cited

U.S. PATENT DOCUMENTS

| | | |
|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 3,066,930 A1 | 11/2011 | Sreenivasan et al. |
| 8,076,386 B2 | 12/2011 | Xu et al. |
| 8,349,241 B2 | 1/2013 | Sreenivasan et al. |
| 8,361,371 B2 | 1/2013 | Khusnatdinov et al. |
| 8,641,958 B2 | 2/2014 | Khusnatdinov et al. |
| 2013/0020281 A1* | 1/2013 | Wakamatsu ........... B41J 2/2135 216/40 |

(Continued)

*Primary Examiner* — Alexander Marion Weddle
(74) *Attorney, Agent, or Firm* — Cameron A. King; Daniel Ratoff

(57) ABSTRACT

A substrate useful for imprint lithography having a location thereon defining an imprint field, the imprint field further defined by an interior region, a perimeter region surrounding the interior region, and a border, with the perimeter region further including fluid control features. A polymerizable material deposited on the substrate at the imprint field location is allowed to spread on the substrate, with the fluid control relief features redirecting the spreading of the polymerizable material so as to minimize spreading of the polymerizable material beyond the imprint field border as further imprint lithography techniques are then performed.

23 Claims, 7 Drawing Sheets

(56) References Cited

U.S. PATENT DOCUMENTS

2013/0120485 A1* 5/2013 Kodama .............. B41J 2/04508
347/14
2015/0017329 A1* 1/2015 Fletcher ................ B29C 43/021
427/277

* cited by examiner

METHODS FOR CONTROLLING SPREAD OF IMPRINT MATERIAL

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Exemplary nanoimprint lithography processes are described in detail in numerous publications, such as U.S. Pat. No. 8,349,241, U.S. Pat. No. 8,066,930, and U.S. Pat. No. 6,936,194, all of which are hereby incorporated by reference herein.

A nanoimprint lithography technique disclosed in each of the aforementioned U.S. patents includes formation of a relief pattern in a formable (e.g. polymerizable) layer and transferring a pattern corresponding to the relief pattern into an underlying substrate. The patterning process typically uses a template spaced apart from the substrate with the formable applied as a liquid to the substrate, e.g., by drop dispense techniques. The formable liquid is solidified to form a solid layer that has a pattern conforming to a shape of the surface of the template that contacts the formable liquid. After solidification, the template is separated from the solidified layer. In certain cases, this process is then repeated across the substrate on a field-by-field basis until the entire substrate is patterned (a so-called "step-and-repeat" process). The substrate is then subjected to additional processes, such as etching processes, to transfer a relief image into the substrate that corresponds to the pattern formed in the solidified layer. In such step-and-repeat processes in particular, it is desirable to avoid extrusion of the formable material beyond the template patterning surface. When such extrusion occurs, it can lead to a variety of imprint and post-imprint defects.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

SUMMARY

In a first general aspect, a substrate is provided having a location thereon defining an imprint field, the imprint field further defined by an interior region, a perimeter region surrounding the interior region, and a border, with the perimeter region further including fluid control features. The provided substrate can then be subjected to methods wherein a polymerizable material is deposited onto the substrate at the imprint field location and allowed to spread on the substrate, with the fluid control relief features redirecting the spreading of the polymerizable material so as to minimize spreading of the polymerizable material beyond the imprint field border.

Implementation of these general aspects may include one or more of the following features. The fluid control features are provided adjacent to the edges of the imprint field border and are directionally oriented parallel to each such edge. The fluid control features are elongated features having a length that is at least 10 or 100 or 1,000 or 10,000 times greater than their width. The fluid control features are lines, line segments, or staggered bars. The fluid control features include protrusions and/or recessions that optionally have a height or depth of from 0.005 to 1 µm.

In further provided aspects, the methods can also include contacting an imprint lithography template with the polymerizable material that is deposited on the substrate so as to fill the relief pattern of the template. The provided imprint lithography template may include one or more of the following features. Fluid control features provided in a region of the template that align with the perimeter region of the imprint field of the substrate. Such fluid control features of the template may be complementary to and aligned with the fluid control features of the substrate. In certain aspects, the fluid control features of the template are complementary to and aligned with or staggered relative to the fluid control features of the substrate. In other aspects, the fluid control features of the template are recessed and staggered relative to protruding fluid control features of the substrate.

In further aspects, the polymerizable material can be solidified to form a patterned layer on the substrate at the imprint field location and the template can be separated from the solidified pattern once formed. The pattern, once formed, can be transferred into the substrate and the substrate further processed to manufacture a device.

Other features and advantages of the present invention will be apparent from the accompanying drawings and from the detailed description that follows.

DETAILED DESCRIPTION

Figure 1:
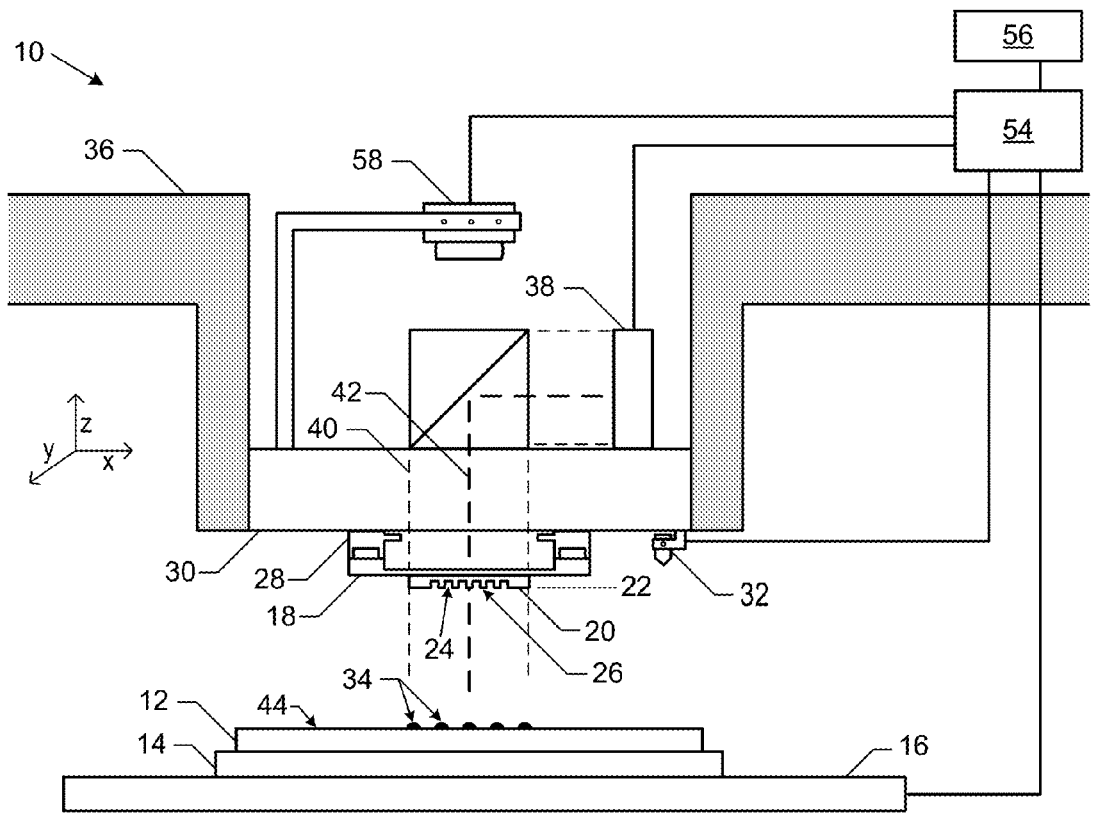
FIG. 1 illustrates a simplified side view of a nanoimprint lithography system having a template and a mold spaced apart from a substrate.

Varying techniques for avoiding extrusion of formable material beyond the template patterning surfaces are further described herein. Referring in particular to FIG. 1, illustrated therein is an exemplary nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. No. 7,157,036 and U.S. Pat. No. 8,076,386, both of which are herein incorporated by reference.

Figure 2:
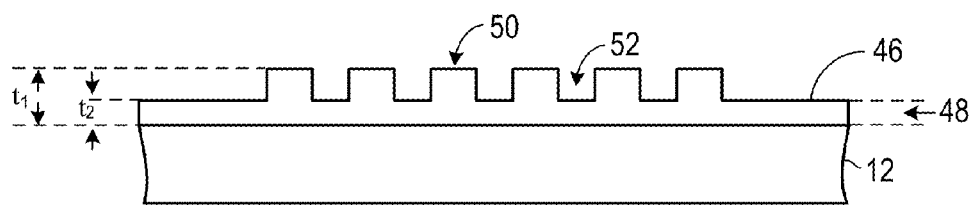
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, source 38, and/or camera 58 and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$. Substrate 12 with patterned layer 46 formed thereon can then be subjected to additional processes, such as etching processes, to transfer a relief image into substrate 12 that corresponds to the pattern of patterned layer 46. The substrate thus patterned can then be further subjected to known steps and processes for device fabrication, including, for example, oxidation, film formation, deposition, doping, planarization, etching, resist removal, dicing, bonding, and packaging, and the like.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

In imprint lithography processes such as those described above, in particular those that employ drop dispense techniques, it is desirable to avoid extrusion of polymerizable material 34 beyond the edge of mesa 20. When such extrusion occurs, it can lead to a variety of imprint and post-imprint defects. For example, in a step-and-repeat process, the extruded material can cause an unwanted build-up of material at the border between the field being imprinted and neighboring fields, or worse can lead to a build-up of material on the neighboring fields themselves. This material build-up will cause a thicker residual layer thickness along these borders, as well as across affected areas of neighboring non-imprinted fields, which in turn causes defects during subsequent wafer fabrication processes that reduce device yield. Similarly, if the material is extruded onto previously imprinted neighboring fields, the extruded material will cover the previously imprinted pattern features, likewise resulting in subsequent processing defects and reduced device yield. In addition, the extruded material can also accumulate on the template mesa sidewall. Portions of this accumulated material can later break-off and be deposited onto subsequently imprinted fields, again leading to processing defects and reduced device yield. Further, such sidewall accumulation can lead to template damage itself, or reduce template working life, or otherwise require costly template repair or reclamation.

Previous extrusion control techniques have focused on template design, including the inclusion of fluid control features, such as those described in U.S. Pat. No. 8,361,371. However, such techniques are effective only insomuch as the template is in position to interact with the polymerizable material, that is, after contact of the template with the material. In processes as described above, the material is first dispensed on the substrate, e.g., as drops, and then the motion stage moves the substrate under the imprint head and into position for the template to move downward and contact the material deposited on the substrate. In processes where template contact is from center-to-perimeter, i.e., contact is initiated at the center of the template mesa and then progressively moves outward toward the mesa edge, the time interval between drop dispense and full contact out to the mesa edges (which corresponds to full contact across a designated imprint field) typically can be 1 second or more. Within this elapsed time period, the drops will have significantly spread, particularly when using a material with a high degree of wettability on the substrate, which is preferable for use in high throughput processes.

As is further described herein, the present invention includes the provision of fluid control features on the substrate that aid in controlling material spread at the edges of the substrate fields prior to template contact as a way to minimize or prevent material extrusion. In certain processes, such features can work alone or in concert with fluid control features located on an imprint template itself. With this approach, wider extrusion control process windows can be developed for incorporation into imprint lithography processes.

Figure 3:
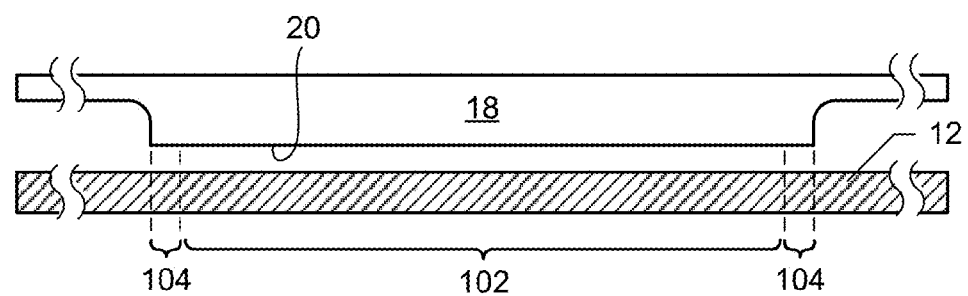
FIG. 3 illustrates a simplified side view of a nanoimprint lithography template spaced apart from a substrate
Figure 4:
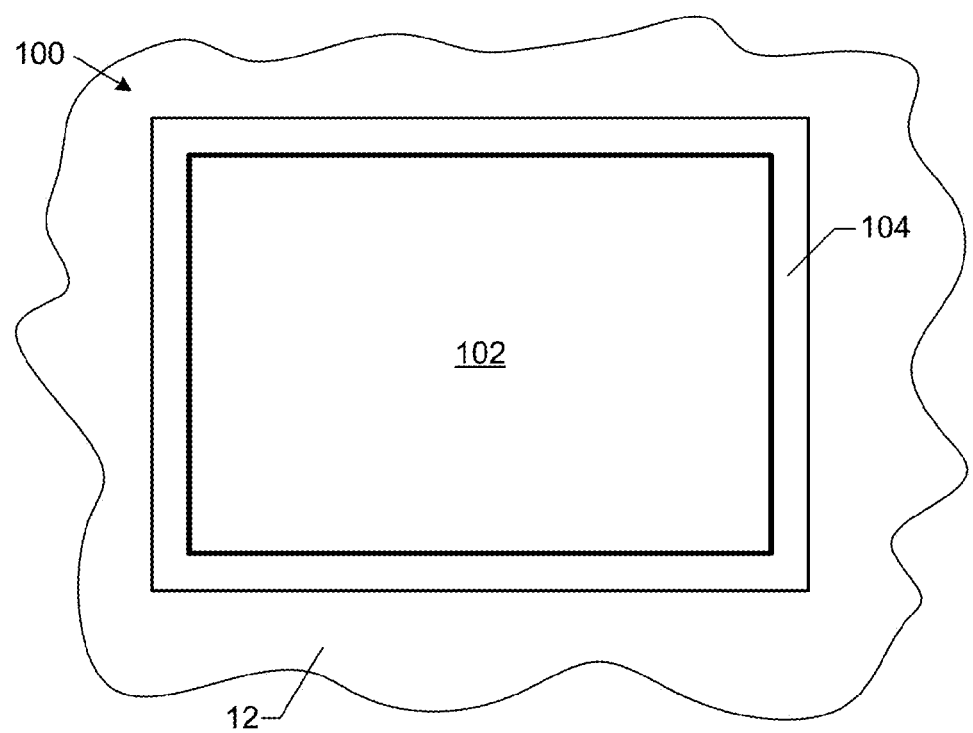
FIG. 4 illustrates a partial top view of the substrate of FIG. 3.
Figure 5A:
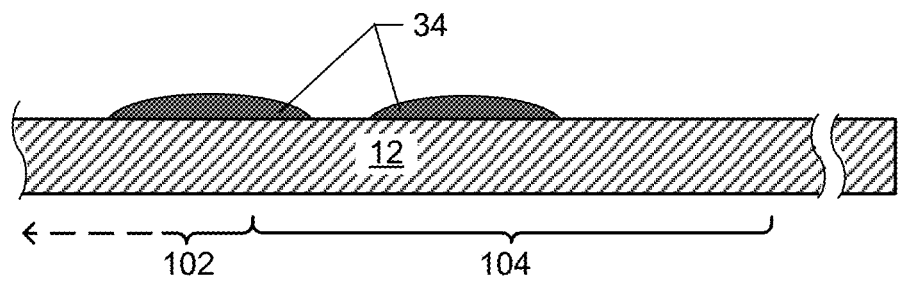
FIGS. 5A-5D illustrate a simplified side view of the lithography template and substrate of FIG. 3 with the template contacting a formable material deposited on the substrate
Figure 5B:
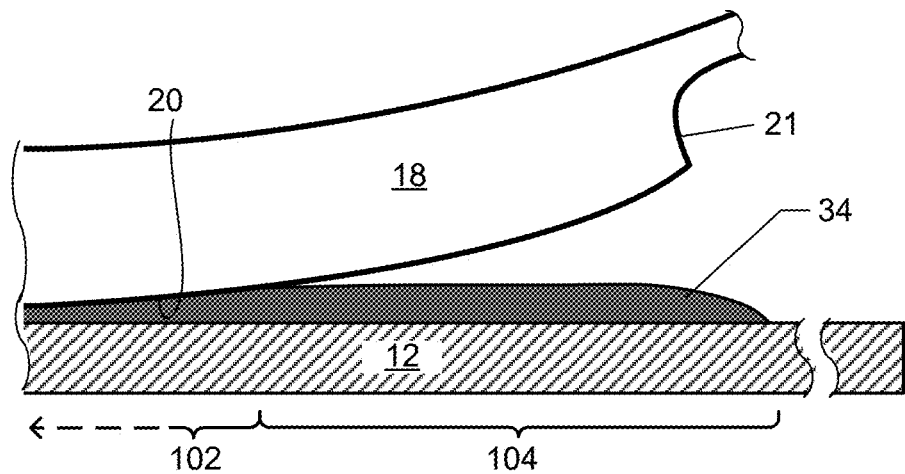
Figure 5C:
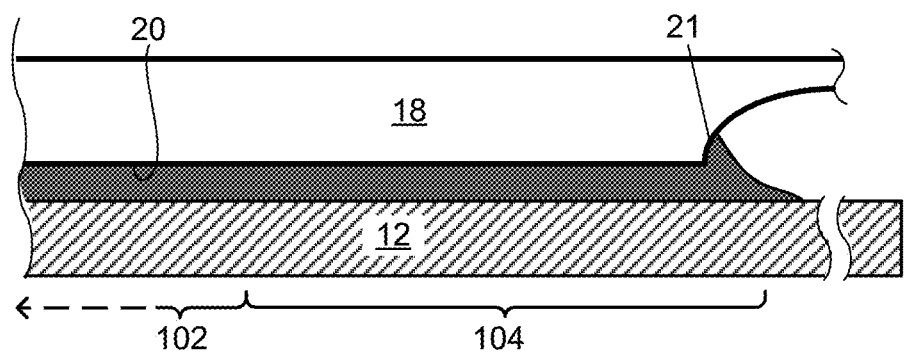
Figure 5D:
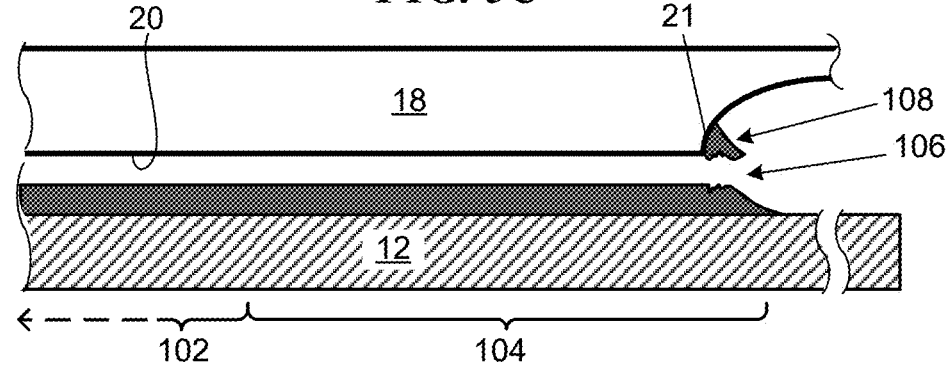

With reference to FIGS. 3 and 4, template 18 with mesa 20 is shown in superimposition with field 100 located on substrate 12. Field 100 is further defined to include interior region 102 and surrounding perimeter region 104. Interior region 102 represents the region within field 100 where the desired pattern to be transferred to substrate 12 for further processing and device fabrication is to be located. The surrounding perimeter region 104, sometimes referred to herein as the kerf region, includes alignment marks and other metrology marks useful in the imprint process or in further processing steps, but such kerf region will ultimately be sacrificed in further processing steps. Turning to FIGS. 5A-5D, a scenario is illustrated where polymerizable material 34 deposited on or near kerf region 104 flows beyond mesa edge 21 prior to full contact of mesa 20 with material 34 and substrate 12. More particularly, FIG. 5A shows substrate 12 with material 34 deposited as droplets which then, as shown in FIG. 5B, spread and merge together as template 18 contacts material 34 and substrate 12. However, in this example, material 34 has spread across and beyond kerf region 104 prior to full contact with template 18, resulting in extruded material extending beyond mesa edge 21 when full contact is achieved, as shown in FIG. 5C. When material 34 is subsequently cured and template 18 separated from substrate 12, as shown in FIG. 5D, defect portion 106 remains on the formed patterned layer with extruded material 108 accumulating on template edge 21, both of which can cause subsequent defects, as previously detailed.

In order to better control for such extruded material, the present invention provides for fluid control features located on the substrate. Such control features are advantageous for preventing extrusions when using, for example, a highly wettable material which rapidly spreads on the substrate. They are also advantageous when using a less rapidly spreading material in order to simply increase the imprint process control window, i.e., to allow for different possible time intervals between material dispense and full template contact in order to accommodate for other process variables. In various embodiments, the control features can be placed along one or more imprint field edges, including within the kerf region. To further control material spreading, the control features can also have a directionality, for example, they can be oriented substantially parallel to the nearest imprint field border or edge. By directionality it is meant that the control features can include repeating elongated features that are oriented generally parallel to the neighboring imprint field edge. These features can be at least 10 times greater in length relative to their width and more preferably at least 10, 100, 1,000 or even 10,000 or more times greater in length relative to their width. The control features can have various designs, including but limited to gratings (i.e., repeating lines and spaces of a specific pitch) line segments, a single- or multi-staggered bar designs, fractional or segmented line designs, single trench designs, checkerboard designs, and the like. One of skill in the art will understand that other feature designs are also useful, provided the implemented design re-directs the spreading material in a direction parallel to the imprint field edge or border. Depending on the imprint application requirements, the width of these features can range from sub-micron widths to several microns in width. In particular embodiments, the fluid control features can be designed to have a width, length, or diameter of between 0.005-20 um, and height (i.e., feature proud) or depth (i.e., feature recessed) of 0.005-1 um. Fluid control features patterned on the substrate can further be surface treated with a material to decrease the wettability of resist on those features. The fluid control features patterned on the substrate can also be used in combination with fluid control features located on the template.

Figure 6A:
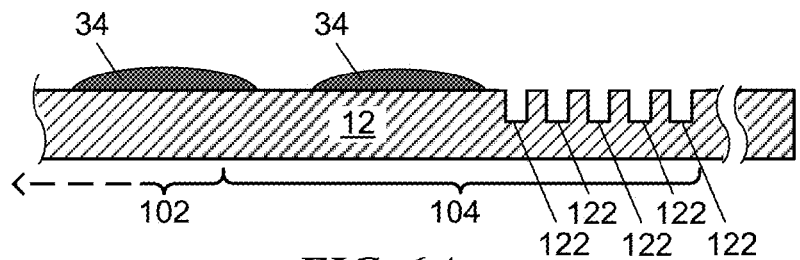
FIGS. 6A-6D illustrate a simplified side view of a lithography template and substrate with the template contacting a formable material deposited on the substrate according to an embodiment of the invention.
Figure 6B:
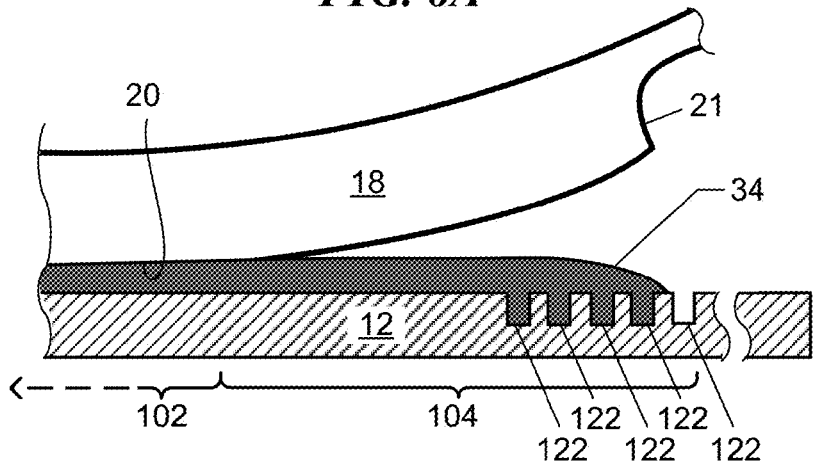
Figure 6C:
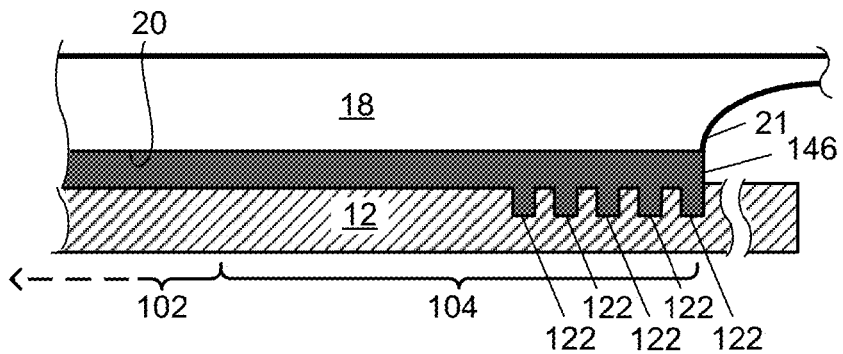
Figure 6D:
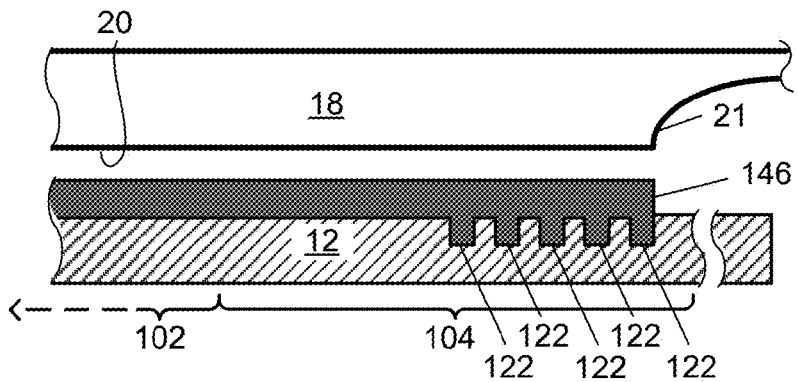

FIGS. 6A-6D illustrate an embodiment with substrate 12 including fluid control features 122 located in kerf region 104 of substrate 12. In FIG. 6A, droplets of polymerizable material 34 are deposited near to and on kerf region 104. The droplets then spread and merge together as template 18 contacts material 34 and substrate 12 (FIG. 6B). However, here as material 34 spreads across kerf region 104 but prior to full contact with template 18, the flow of the material constrained and re-directed by fluid control features so as not extend beyond kerf region 104. When full template contact is achieved, as shown in FIG. 6C, material 34 remains within the imprint field and does not extrude beyond the edge of the field. As a result, subsequent curing and separation (FIG. 6D) do not produce any extrusion-related defects.

Fluid control features such as features 122 can be formed on the substrate using lithography processes known to one of skill in the art, including but not limited to optical lithography or imprint lithography processes. Further, in certain situations, such processes can be incorporated into existing process flow. For example, it is often typical that a substrate will be subjected to a planarization step prior to imprinting a desired pattern onto the substrate. Such a planarization step can be performed using a blank imprint template, i.e., an imprint template having a flat, planar patterning surface. Such a template can instead be provided with a relief pattern corresponding to the desired fluid control features located near the edges of the template such that the desired fluid control features are imprinted in the kerf region while the active area of the field is planarized. A subsequent etch step is then performed to etch the relief features into the kerf region of the field. Similarly, a planarization step followed by an optical lithography process can be used to form the desired fluid control features into the substrate. That is, a planarizing layer can be coated on the entire substrate, e.g., by a spin-on process, followed by an optical lithography step to pattern the desired fluid control features into the planarizing layer. From here a subsequent etch step likewise etches the desired fluid control features into the substrate. Similarly, such imprint lithography or optical lithography patterning can be performed prior to planarization or even without planarization to achieve a similar effect.

Figure 7A:
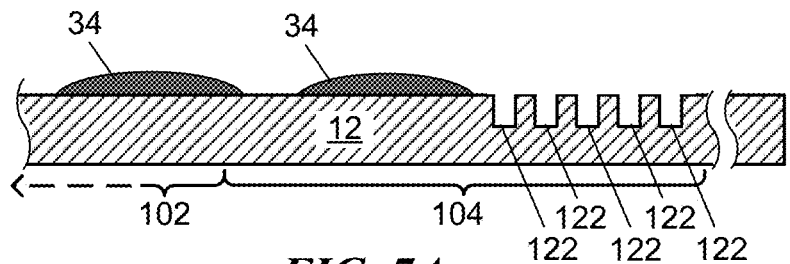
FIGS. 7A-7D illustrate a simplified side view of a lithography template and substrate with the template contacting a formable material deposited on the substrate according to another embodiment of the invention.
Figure 7B:
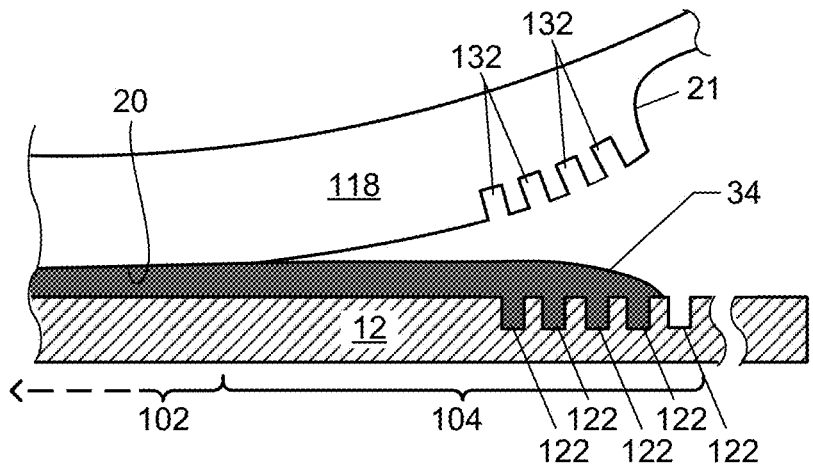
Figure 7C:
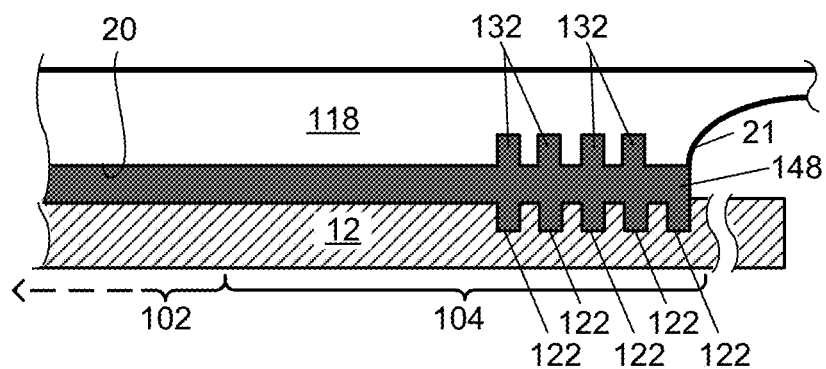
Figure 7D:
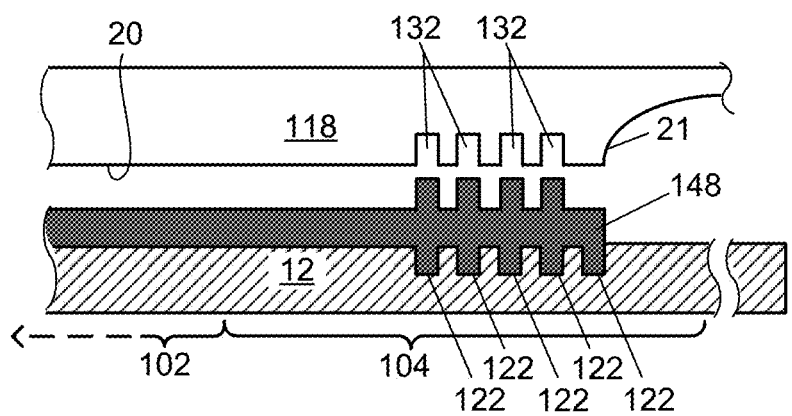
Figure 8A:
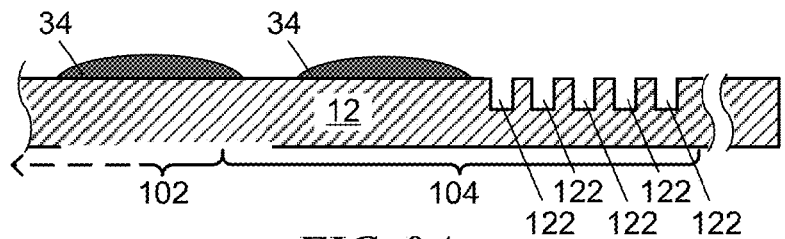
FIGS. 8A-8D illustrate a simplified side view of a lithography template and substrate with the template contacting a formable material deposited on the substrate according to yet another embodiment of the invention.
Figure 8B:
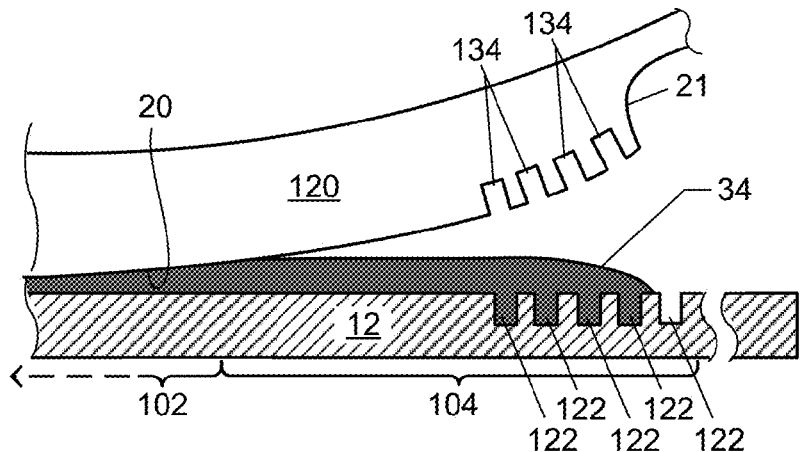
Figure 8C:
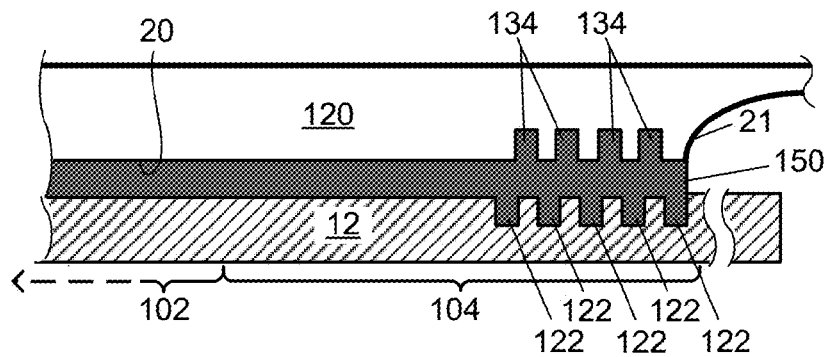
Figure 8D:
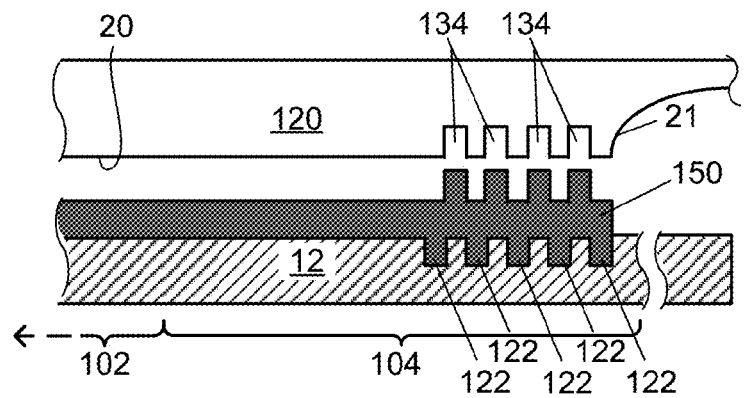
Figure 9A:
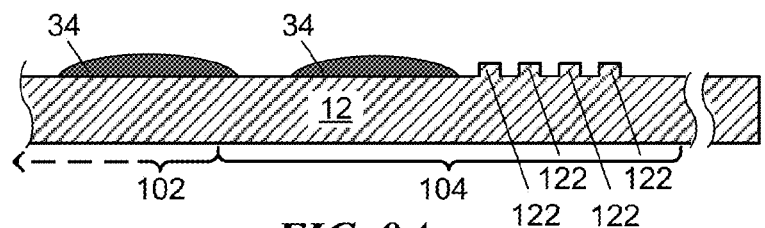
FIGS. 9A-9D illustrate a simplified side view of a lithography template and substrate with the template contacting a formable material deposited on the substrate according to a further embodiment of the invention.
Figure 9B:
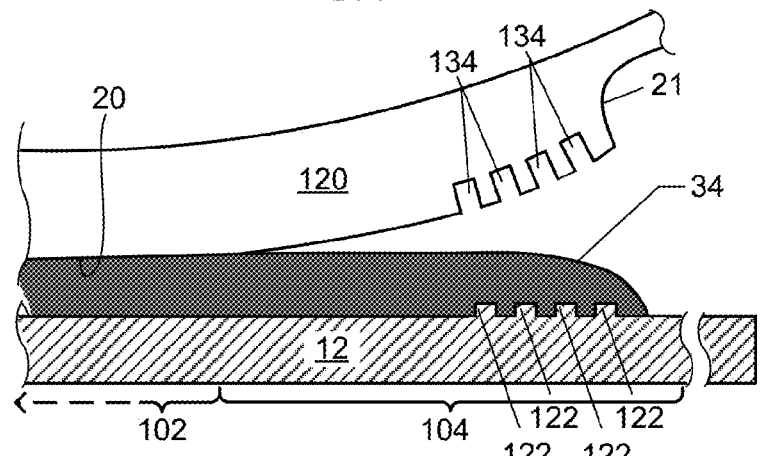
Figure 9C:
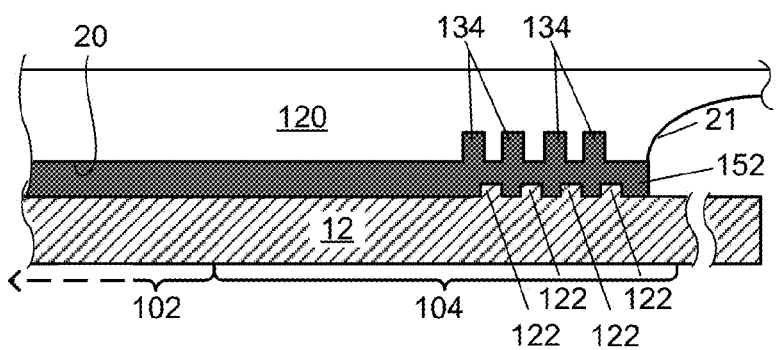
Figure 9D:
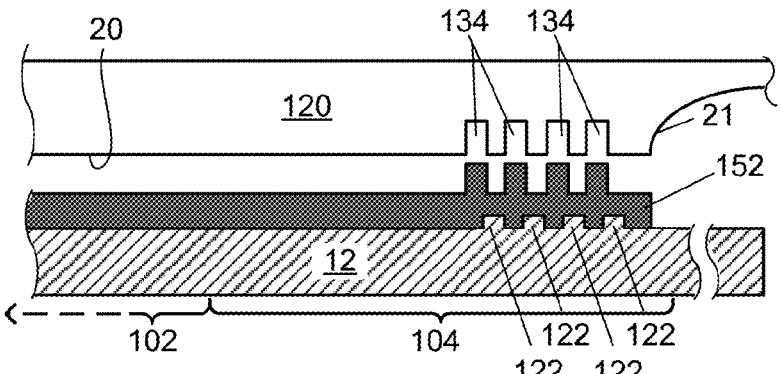

FIGS. 7A-7D illustrate another embodiment of the invention. Here substrate 12 includes fluid control features 122 as shown above in FIGS. 6A-6D but further in combination with template 118 that is likewise provided with complementary fluid control features 132. With particular reference to FIGS. 7B and 7C, template control features 132 are positioned to align with features 122 on substrate 12. With features 122 and 132 so aligned, larger effective channels between the template and substrate are created for fluid containment. That is, for same two-dimensional area a greater volume of material can be constrained and re-directed. Further, by constraining such larger volume of material, the associated capillary pressure of the material at the field boundary edge is reduced. Because capillary pressure drives fluid flow, reducing capillary pressure fluid reduces the flow rate at the boundary, which further aids in limiting material extrusion.

FIGS. 8A-8D depict a similar embodiment. Here template 120 is also provided with complementary fluid control features 134, however these are positioned to be offset from fluid control features 122 on substrate 12. This arrangement can similarly constrain and re-direct a larger volume of material across the same two-dimensional area.

FIGS. 9A-9D illustrate an embodiment where fluid control features 122 on substrate 12 are raised, i.e., extend upward from the substrate 12 surface. It is desirable that such features 122 do not extend higher than the target residual layer thickness of resultant formed pattern layer 152, so as not to risk direct of the features with the template, which can lead to, among other things, template damage or excessively high frictional forces that could interfere with alignment of the template with the substrate. Here the corresponding fluid control features 134 of template align are positioned relative to fluid control features 122 to provide similar advantages of the embodiment of FIGS. 7A-7D, with the added advantage of further restricting fluid flow at the raised feature locations.

In further embodiments (not shown), the substrate can be provided with both raised and recessed fluid control features, and can be used either alone or in combination with templates having complementary fluid control features. As one example of such a combination, the recessed fluid control of both the substrate and the template can be aligned, creating larger effective channels for fluid control as in FIGS. 7A-7D, with the raised features providing for additional fluid restriction of fluid flow between such channels. In yet further embodiments, the template fluid control features can further include multiple steps and/or multiple etch depths to provide further control over how the fluid is constrained and re-directed.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising the steps of:
providing a substrate having a location thereon defining an imprint field having a border, the imprint field further defined by an interior region and a perimeter region surrounding the interior region, wherein the perimeter region further includes fluid control features in the substrate;
depositing a polymerizable material onto the substrate at the imprint field location; and
allowing the polymerizable material to spread on the substrate, wherein fluid control relief features redirect spreading of the polymerizable material so as to redirect the spreading of the polymerizable material away from the imprint field border.

2. The method of claim 1 wherein the imprint field border has one or more edges and wherein the fluid control features adjacent each such edge are directionally oriented parallel to such edge.

3. The method of claim 1 wherein the fluid control features further comprise elongated features having a length that is at least 10 or 100 or 1,000 or 10,000 times greater than their width.

4. The method of claim 1 wherein the fluid control features further comprise line segments or staggered bars.

5. The method of claim 1 wherein the fluid control features includes protrusions that extend upward from the substrate.

6. The method of claim 1 wherein the fluid control features includes protrusions that have a height of from 0.005 to 1 µm extending upward from the substrate and/or recesses that have a depth from 0.005 to 1 µm extending downward into the substrate.

7. The method of claim 1, wherein the fluid control feature redirects the polymerizable material parallel to the imprint field border.

8. The method of claim 1, wherein the fluid control feature constrains the polymerizable material so that less of the polymerizable material extrudes beyond the imprint field border relative to if the substrate did not have the fluid control feature.

9. The method of claim 1 further comprising the step of contacting an imprint lithography template having a pattern surface with a relief pattern located thereon with the polymerizable material on the substrate so as to fill the relief pattern of the template.

10. The method of claim 9 wherein the imprint lithography template includes fluid control features in a region that aligns with the perimeter region.

11. The method of claim 10 wherein the fluid control features of the template are complementary to and aligned with the fluid control features of the substrate.

12. The method of claim 10 wherein the fluid control features of the template are complementary to and staggered relative to the fluid control features of the substrate.

13. The method of claim 10 wherein the fluid control features of the template are recessed and staggered relative to protruding fluid control features of the substrate.

14. The method of claim 9, wherein the fluid control feature redirects the polymerizable material prior to the step of fully contacting the lithography template with the polymerizable material on the substrate.

15. The method of claim 9 further comprising the step of solidifying the polymerizable material to form a patterned layer on the substrate at the imprint field location.

16. The method of claim 15 further comprising the step of separating the template from the formed patterned layer.

17. A method of manufacturing a device comprising:
forming a pattered layer on the substrate in accordance with the method of claim 15;
transferring a pattern of the patterned layer into the substrate; and
processing the substrate to manufacture the device.

18. A substrate having a location thereon defining an imprint field having a border, the imprint field further defined by an interior region and a perimeter region surrounding the interior region, wherein the perimeter region further includes fluid control features in the substrate.

19. The substrate of claim 18 wherein the imprint field border has one or more edges and wherein the fluid control features adjacent each such edge are directionally oriented parallel to such edge.

20. The substrate of claim 18 wherein the fluid control features further comprise elongated features having a length that is at least 10 or 100 or 1,000 or 10,000 times greater than their width.

21. The substrate of claim 18 wherein the fluid control features further comprise line segments or staggered bars.

22. The substrate of claim 18 wherein the fluid control features further comprise protrusions on the substrate or recesses in the substrate.

23. The substrate of claim 22 wherein the protrusions or recesses have a height or depth of from 0.005 to 1 μm.

* * * * *